(12) United States Patent
Voisine (10) Patent No.: US 7,471,516 B2
(45) Date of Patent: Dec. 30, 2008

(54) METER WITH REDUCED INTERNAL TEMPERATURE RISE AND ASSOCIATED METHOD

(75) Inventor: John T. Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 38 days.

(21) Appl. No.: 11/582,247

(22) Filed: Oct. 14, 2006

(65) Prior Publication Data
US 2007/0091548 A1  Apr. 26, 2007

Related U.S. Application Data (60) Provisional application No. 60/726,564, filed on Oct. 14, 2005.

(51) Int. Cl.
*H02B 1/00* (2006.01)
*H05K 7/20* (2006.01)

(52) U.S. Cl. ............... 361/704; 361/659; 361/664; 361/700; 361/714

(58) Field of Classification Search ............ None
See application file for complete search history.

(56) References Cited

U.S. PATENT DOCUMENTS

| | | | |
|---|---|---|---|
| 5,503,271 A * | 4/1996 | Lynch | 206/305 |
| 5,887,435 A * | 3/1999 | Morton | 62/3.6 |
| 6,134,110 A * | 10/2000 | Langari | 361/700 |
| 6,186,842 B1 * | 2/2001 | Hirschbold et al. | 439/876 |
| 6,205,025 B1 * | 3/2001 | Chen | 361/704 |
| 6,493,644 B1 * | 12/2002 | Jonker et al. | 702/61 |
| 6,674,643 B2 * | 1/2004 | Centola et al. | 361/720 |
| 6,713,675 B2 * | 3/2004 | Lukas | 174/559 |
| 6,798,191 B1 * | 9/2004 | Macfarlane et al. | 324/157 |
| 6,838,867 B2 * | 1/2005 | Loy | 324/142 |
| 7,084,783 B1 * | 8/2006 | Melvin et al. | 340/870.02 |

* cited by examiner

*Primary Examiner*—Boris L Chervinsky
(74) *Attorney, Agent, or Firm*—Maginot, Moore & Beck (57) ABSTRACT

An utility meter is provided. The meter includes a base and a first barrier operably associated with the base. The base and the first barrier define a first compartment between the base and the first barrier. The meter also includes a heat generating component positioned in the first compartment and operably associated with the base. The meter also includes a second barrier extending from the base. The second barrier and the first barrier define a second compartment between the second barrier and the first barrier. The meter further includes an arrangement for moving heat connected to the heat generating component and extending from the first compartment to the second compartment.

20 Claims, 7 Drawing Sheets

METER WITH REDUCED INTERNAL TEMPERATURE RISE AND ASSOCIATED METHOD

CROSS-REFERENCE TO RELATED APPLICATIONS

This Application is a utility patent application claiming priority to U.S. Provisional Patent Application, Ser. No. 60/726,564 filed Oct. 14, 2005, entitled METHOD OF REDUCING INTERNAL TEMPERATURE RISE IN AN ELECTRICITY METER. The disclosure of 60/726,564 filed Oct. 14, 2005, entitled METHOD OF REDUCING INTERNAL TEMPERATURE RISE IN AN ELECTRICITY METER is hereby totally incorporated by reference in its entirety.

FIELD OF THE INVENTION

This invention relates to reducing the temperature rise at the location of the circuit board in a utility meter, and in particular for reducing temperature rise due at least in part to heat generated by electrical components located on circuit boards in utility meters.

BACKGROUND OF THE INVENTION

In the past, utility meters such as gas, water and electricity meters employed primarily mechanical registers and devices. While electricity meters always contained devices that sense electrical energy, the registration of such sensed energy was often carried out mechanically using gears and dials. More recently, utility meters have increasingly relied upon electronic circuits that provide enhanced functionality. At present, electricity meters often contain one or more circuit boards that provide advanced consumption registration functions, automatic meter reading functions, diagnostics, profiling and other functions. While gas and water meters do not at present typically employ significant circuitry, such meters can benefit from similar features.

A problem sometimes encountered with utility meters that employ electronic circuits is excessive temperature rise inside the cover of the meter due to heat generated by electronic components. As internal temperature rises the expected life of electronic components is reduced. Consequently it is desirable to limit the increase in temperature in the area of electronic components. Unfortunately, electric meters must be enclosed in such a manner as to pass the metering industry's weather simulation tests such as C12.1-2001 section 4.7.3.22. Such weathering requirements prevent the addition of air vents or other traditional means of reducing internal temperature rise of electronic devices.

As a consequence, the amount and/or functionality of electronic circuitry within meters is limited at least partly by the associated heat rise caused by additional circuitry and/or functionality. Limiting functionality is important because the same component, such as a processor, can generate more or less heat based on its usage.

SUMMARY OF THE INVENTION

The present invention provides for the possibility of increasing the heat generated by components within the meter while reducing the degradation caused by such heat. The present invention includes an arrangement for moving heat away from the proximity of the electronic components.

In one embodiment, the arrangement includes a heat conductive member that extends from a first compartment containing at least one heat generating component to a second compartment in the meter, at least a first barrier separating the first compartment from the second compartment. The first compartment and the second compartment need not be completely isolated from one another, so long as the barrier defines an area in a substantial amount of heat may be held away from the heat generating component.

In another embodiment, a utility meter includes a power line carrier modem circuit that allows data communications over the power lines, and further includes an arrangement for moving at least some heat generated by the modem circuit to another part of the meter. The use of a broadband power line carrier modem allows for customers of the utility to obtain broadband Internet access via their meter. However, modem circuits use much more power and therefore generate much more heat than traditional meter electronics. Accordingly, the arrangement for moving the heat allows for the broadband power line carrier modem to be housed within the meter.

According to another embodiment of the present invention an utility meter is provided. The meter includes a base and a first barrier operably associated with the base. The base and the first barrier define a first compartment between the base and the first barrier. The meter also includes a heat generating component positioned in the first compartment and operably associated with the base. The meter also includes a second barrier extending from the base. The second barrier and the first barrier define a second compartment between the second barrier and the first barrier. The meter further includes an arrangement for moving heat connected to the heat generating component and extending from the first compartment to the second compartment.

According to yet another embodiment of the present invention an electric utility meter is provided. The meter includes a base and a barrier operably associated with the base. The base and the barrier define a first compartment between the base and the barrier. The meter also includes a heat generating component positioned in the first compartment and operably associated with the base. The meter also includes a cover extending from the base. The cover and the barrier define a second compartment between the cover and the barrier. The meter further includes an arrangement for moving heat connected to the heat generating component and extending from the first compartment to the second compartment According to another embodiment of the present invention a method for removing heat from a component in a cavity of a utility meter is provided. The method includes the steps of providing a barrier to separate the cavity of the meter into an inner compartment and an outer compartment and placing the component in the inner compartment of the meter. The method also includes the steps of attaching an arrangement for moving heat to the component and positioning the arrangement for moving heat in the inner compartment and the outer compartment. The method further includes the step of transferring heat from the component with the arrangement for moving heat to the outer compartment.

The above described features and advantages as well as others, will become more readily apparent to those of ordinary skill in the art by reference to the following detailed description and accompanying drawings.

DETAILED DESCRIPTION

Figure 1:
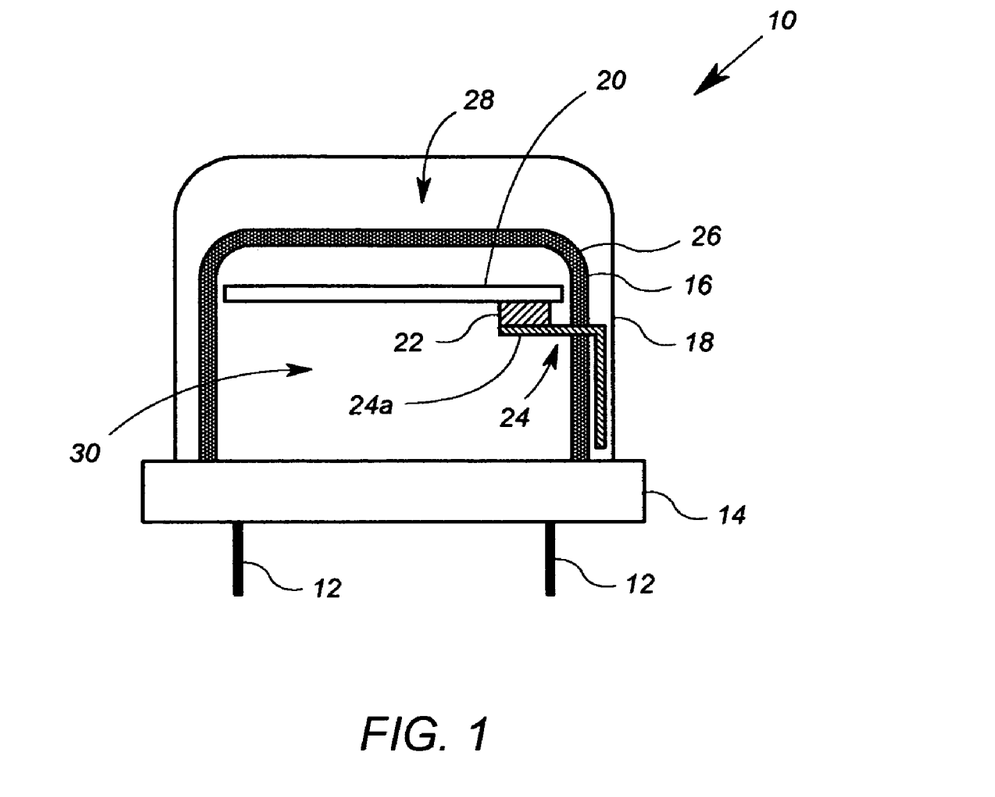
FIG. 1 shows a representative diagram of a cutaway view of a first embodiment of a meter according to the invention.

FIG. 1 shows an exemplary arrangement according to the present invention. FIG. 1 shows a meter 10 in side cutaway view. However, many well known meter components have been removed for clarity of exposition, but would suitably be incorporated into the meter 10. The meter 10, as shown if FIG. 1, is an electricity meter. It should be appreciated that the present invention may be equally well suited for use in any utility meter, for example a gas meter or a water meter in which components that generate heat are used.

The electric meter 10 includes meter blades 12, a meter base 14, a first barrier 16 in the form of, for example, an inner cover 16, an second barrier 18 in the form of, for example, an outer cover 18, at least a first circuit board 20 in the form of, for example a printed wiring board (PWB) which supports at least a first heat generating component 22, and an arrangement 24 for moving heat. The meter blades 12 are traditional meter blades intended to couple to a meter socket, and may take any traditional meter blade form. The meter base 14 defines a platform on which the meter blades 12 and the covers 16 and 18 are mounted or supported. The first circuit board 20 contains at least some of the electronic components that carry out functions in the meter 10. The functions can include metering functions such as those taught by U.S. Pat. No. 5,627,759, U.S. Pat. No. 6,112,158, U.S. Pat. No. 5,933,004, and/or those found in the Focus™ Meter sold by Landis+Gyr, Inc. of Lafayette, Ind. The disclosures in U.S. Pat. No. 5,627,759, U.S. Pat. No. 6,112,158, and U.S. Pat. No. 5,933,004 are hereby totally incorporated by reference in their entireties. The heat generating component 22 may be any device, group of devices, or integrated circuit that generates or dissipates heat by using or processing electricity.

The arrangement 24 for moving heat includes a heat conductive element.

As shown in FIG. 1, the inner cover 16 is positioned between the printed wiring board (PWB) 20 and the outer cover 18. In the embodiment described herein, the inner cover 16 and the outer cover 18 are substantially cylindrical shape. Generally two cover meter configurations are known. Other shapes of the cover, for example square, polygon, or rectangular may be suited for the meter.

The inner cover 16 incorporates or is attached to an insulating material layer 26 to thermally insulate the air space in outer compartment 28 between the inner cover 16 and the outer covers 18 from the air space in inner compartment 30 defined by the inner cover 16 and the meter base 14. The arrangement 24 for moving heat is this embodiment is a heat sink 24 attached to the heat generating component 22 on the PWB 20. The heat sink 24 provides a thermal path for heat generated by the component 22 to travel to the air space in the outer compartment 28 between the two covers 16 and 18. The temperature of the air space in the outer compartment 28 will tend to increase due to the heat dissipated from the heat sink 24. Because of the increase in temperature in the outer compartment 28 between the inner and outer covers 16 and 18, the transfer of heat through walls of the outer cover 18 is increased.

Conduction of heat back into the compartment 30 is reduced by the barrier formed by the inner cover 16, and is further reduced by incorporating the insulating material layer 26 on the walls of the inner cover 16. As a consequence, the temperature rise within the compartment 30 is reduced compared to the temperature rise that would occur if no inner cover were present or if no insulating material were used on the walls of the inner cover 16.

Figure 2:
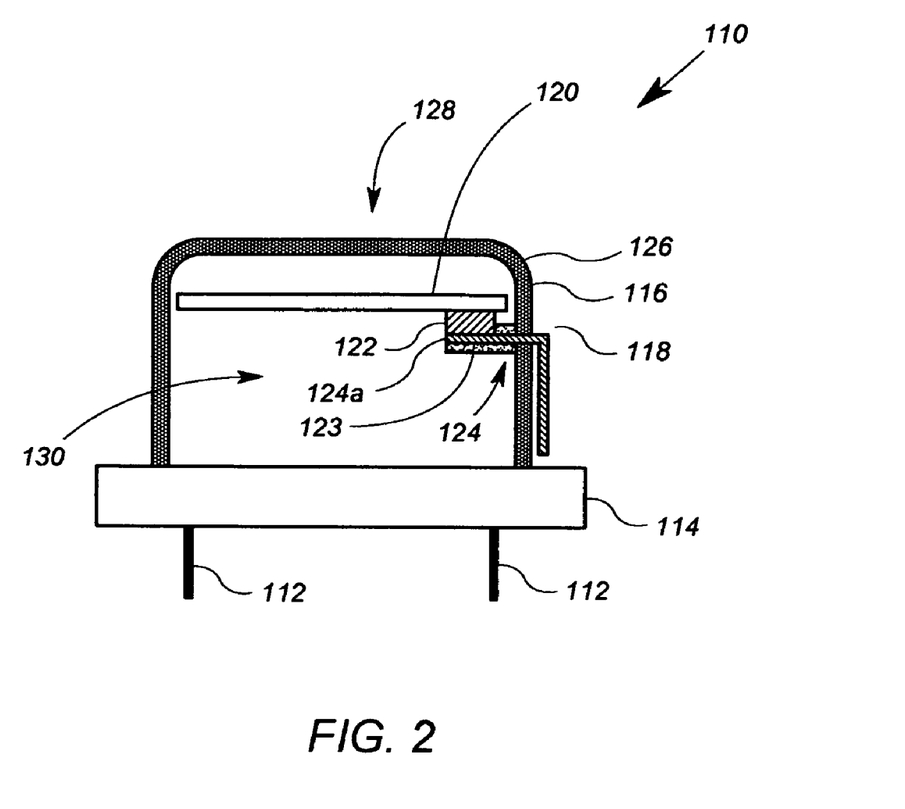
FIG. 2 shows a representative diagram of a cutaway view of another embodiment of a meter according to the invention with insulation placed on the heat generating component.

Referring now to FIG. 2, another embodiment of the present invention is shown as electric meter 110. The electric meter 110 includes meter blades 112, a meter base 114, a first barrier 116 in the form of, for example, an inner cover, a second barrier 118 in the form of, for example, an outer cover, at least a first circuit board 120 in the form of, for example a printed wiring board (PWB) which supports at least a first heat generating component 122, and an arrangement 124 for moving heat. The inner cover 116 incorporates or is attached to an insulating material layer 126 to thermally insulate the air space in outer compartment 128 between the inner cover 116 and the outer cover 118 from the air space in inner compartment 130 defined by the inner cover 116 and the meter base 114. Additional insulating material 123 is placed on the surfaces of that portion 124a of the arrangement 124 that is located within the inner compartment 130. Adding insulation in this manner would further reduce heat transfer to the air space in inner compartment 130 and consequently further limit temperature rise within the inner cover 116.

Figure 3:
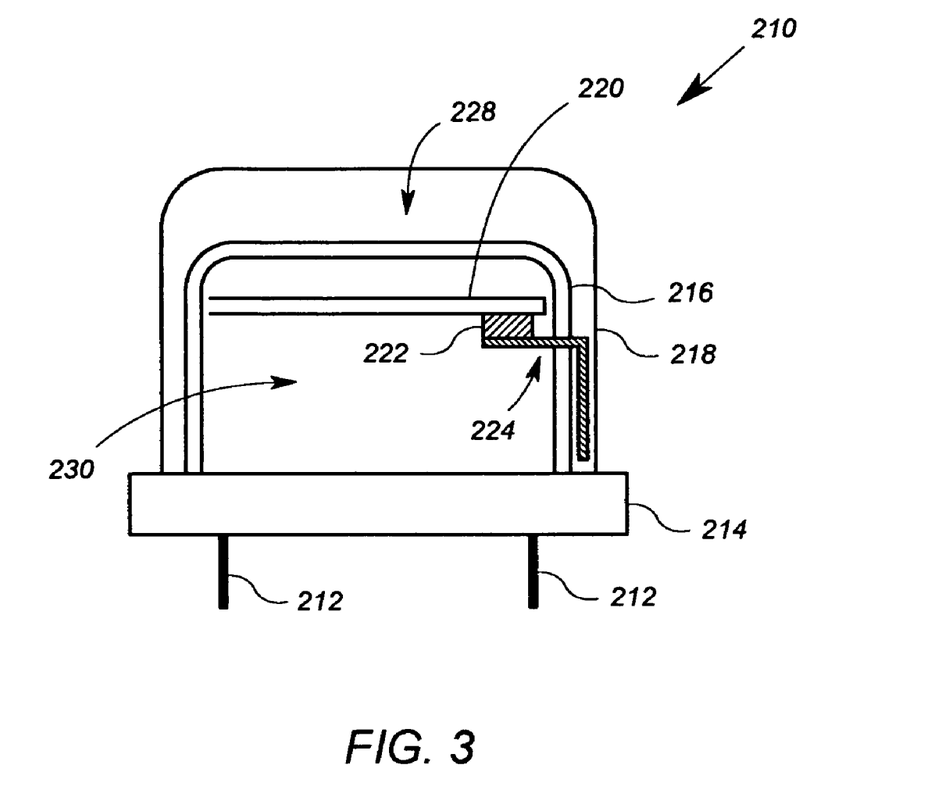
FIG. 3 shows a representative diagram of a cutaway view of another embodiment of a meter according to the invention with a barrier that is not insulated separating the inner and outer compartments.

Referring now to FIG. 3, another embodiment of the present invention is shown as electric meter 210. The electric meter 210 includes meter blades 212, a meter base 214, a first barrier 216 in the form of, for example, an inner cover, a second barrier 218 in the form of, for example, an outer cover, at least a first circuit board 220 in the form of, for example a printed wiring board (PWB) which supports at least a first heat generating component 222, and an arrangement 224 for moving heat.

Unlike the inner cover 16 of FIG. 1 and the inner cover 116 of FIG. 2, the inner cover 216 of FIG. 3 is provided without additional insulating material. The cover 216 of FIG. 3 is suitable if the amount of heat generated by the circuitry is relatively small. The inner cover 216 may for example be made of a plastic, for example a polycarbonate that may not be transparent.

An outer compartment 228 is provided between the inner cover 216 and the outer cover 218 and an inner compartment 230 is defined by the inner cover 216 and the meter base 214.

Figure 4:
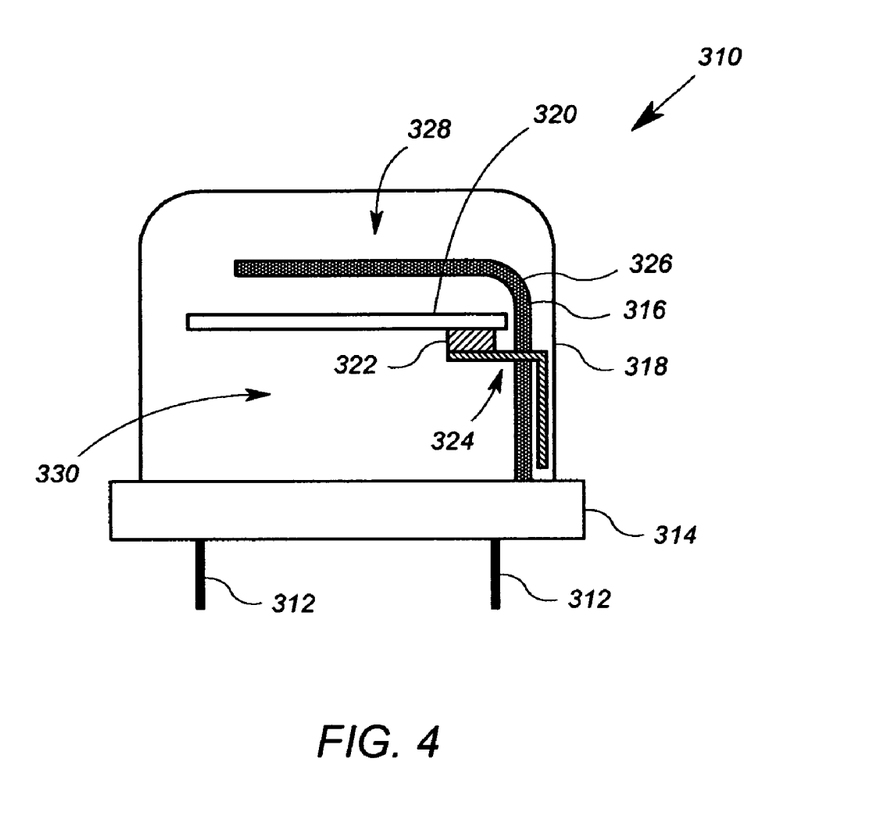
FIG. 4 shows a representative diagram of a cutaway view of another embodiment of a meter according to the invention with a barrier that does not completely separate the inner and outer compartments

Referring now to FIG. 4, another embodiment of the present invention is shown as electric meter 310. The electric meter 310 includes meter blades 312, a meter base 314, a first barrier 316 in the form of, for example, an inner cover, a second barrier 318 in the form of, for example, an outer cover, at least a first circuit board 320 in the form of, for example a printed wiring board (PWB) which supports at least a first heat generating component 322, and an arrangement 324 for moving heat.

The inner cover 316 incorporates or is attached to an insulating material layer 326 to thermally insulate the air space in outer compartment 328 between the inner cover 316 and the outer cover 318 from the air space in inner compartment 330 defined by the inner cover 316 and the meter base 314.

Unlike the inner cover 16 of FIG. 2, the inner cover 116 of FIG. 3 and the inner cover 216 of FIG. 3, the inner cover 316 of FIG. 4 does not fully separate the air space in outer compartment 328 between the inner cover 316 and the outer cover 318 from the air space in compartment 330.

Figure 5:
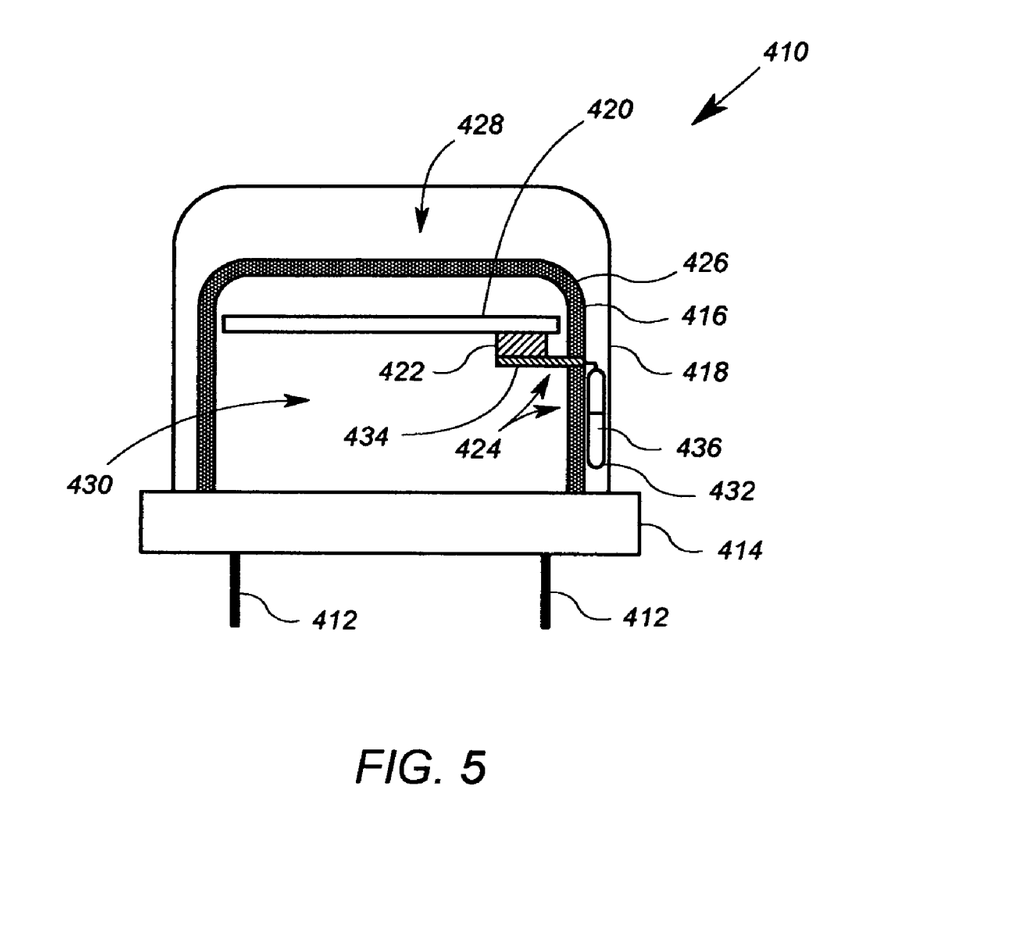
FIG. 5 shows a representative diagram of a cutaway view of another embodiment of a meter according to the invention with a heat pipe as the heat generating component.

Referring now to FIG. 5, another embodiment of the present invention is shown as electric meter 410. The electric meter 410 includes meter blades 412, a meter base 414, a first barrier 416 in the form of, for example, an inner cover, a second barrier 418 in the form of, for example, an outer cover, at least a first circuit board 420 in the form of, for example a printed wiring board (PWB) which supports at least a first heat generating component 422, and an arrangement 424 for moving heat.

The inner cover 416 incorporates or is attached to an insulating material layer 426 to thermally insulate the air space in outer compartment 428 between the inner cover 416 and the outer cover 418 from the air space in inner compartment 430 defined by the inner cover 416 and the meter base 414.

Unlike the arrangement 24 for moving heat of FIG. 1, the arrangement 124 for moving heat of FIG. 2, the arrangement 224 for moving heat of FIG. 3 and the arrangement 324 for moving heat of FIG. 4, the arrangement 424 for moving heat of FIG. 5 is in the form of a heat pipe.

The heat pipe 424 includes of a sealed hollow tube 432, made of a thermo conductive metal such as copper or aluminum is positioned in the outer compartment 428. A conductive member 434 is attached to the 422 and to the tube 432. The tube 432 contains a relatively small quantity of a "working fluid" or coolant 436 (such as water, ethanol or mercury) with the remainder of the pipe being filled with vapor phase of the working fluid, all other gases being excluded.

A typical heat pipe consists of a sealed hollow tube. A thermo conductive metal such as copper or aluminum is used to make the tube. The pipe contains a relatively small quantity of a "working fluid" or coolant (such as water, ethanol or mercury) with the remainder of the pipe being filled with vapor phase of the working fluid, all other gases being excluded.

On the internal side of the tube's side-walls a wick structure exerts a capillary force on the liquid phase of the working fluid. This is typically a sintered metal powder or a series of grooves parallel to the tube axis, but it may in principle be any material capable of soaking up the coolant.

Heat pipes contain no moving parts and typically require no maintenance, though non-condensing gases that diffuse through the pipe's walls may eventually reduce the effectiveness, particularly when the working fluid's vapor pressure is low.

The materials and coolant chosen depends on the temperature conditions in which the heat pipe must operate, with coolants ranging from liquid helium for extremely low temperature applications to mercury for high temperature conditions. However, the vast majority of heat pipes uses either ammonia or water as working fluid.

The advantage of heat pipes is their great efficiency in transferring heat. They are actually a better heat conductor than an equivalent cross-section of solid copper. Additional information related to heat pipes can be found in Grover, G. M., T. P. Cotter, and G. F. Erickson (1964). "Structures of Very High Thermal Conductance". *Journal of Applied Physics* 35 (6): 1990-1991, hereby incorporated by reference herein in its entirety.

Figure 6:
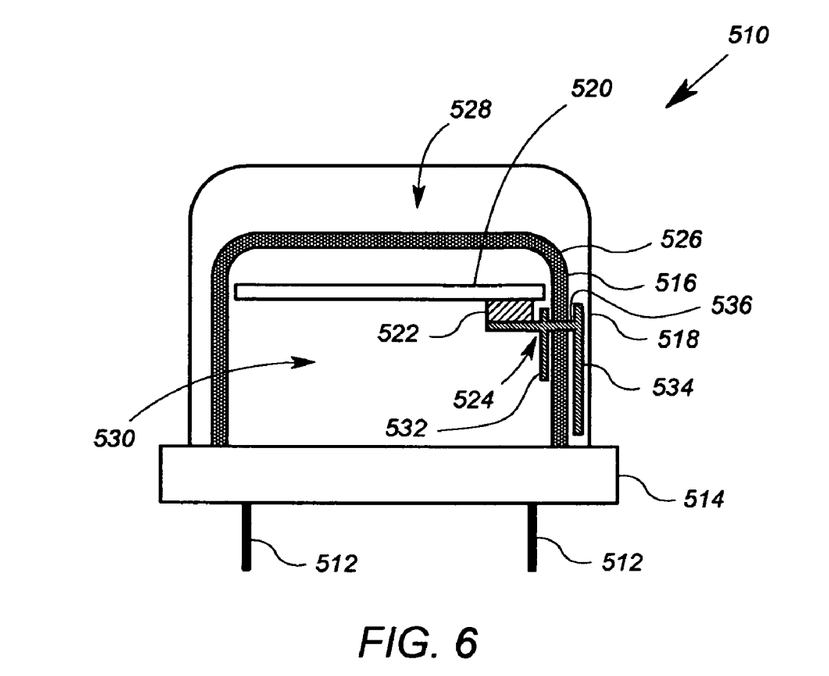
FIG. 6 shows a representative diagram of a cutaway view of another embodiment of a meter according to the invention with a thermoelectric component as the heat generating component.

Referring now to FIG. 6, another embodiment of the present invention is shown as electric meter 510. The electric meter 510 includes meter blades 512, a meter base 514, a first barrier 516 in the form of, for example, an inner cover, a second barrier 518 in the form of, for example, an outer cover, at least a first circuit board 520 in the form of, for example a printed wiring board (PWB) which supports at least a first heat generating component 522, and an arrangement 524 for moving heat.

The inner cover 516 incorporates or is attached to an insulating material layer 526 to thermally insulate the air space in outer compartment 528 between the inner cover 516 and the outer cover 518 from the air space in inner compartment 530 defined by the inner cover 516 and the meter base 514.

Unlike the arrangement 24 for moving heat of FIG. 1, the arrangement 124 for moving heat FIG. 2, the arrangement 224 for moving heat of FIG. 3 and the arrangement 324 for moving heat of FIG. 4, the arrangement 524 for moving heat of FIG. 6 is in the form of a thermoelectric arrangement 524 utilizing thermoelectric cooling.

The thermoelectric arrangement 524 includes a thermally conductive cool plate 532 attached to the component 522 and positioned in the inner compartment 530. The arrangement 524 also includes a thermally conductive hot plate 534 positioned in the outer compartment 530. A thermoelectric component 536 is attached to the cool plate 532 and to the hot plate and is positioned in the inner compartment 530, outer compartment 528 or both.

Thermoelectric cooling uses the Peltier effect to create a heat flux between the junction of two different types of materials. This effect is commonly used in camping and portable coolers and for cooling electronic components and small instruments. There are no moving parts and such a device is maintenance free. Due to the relatively low efficiency, thermoelectric cooling is generally only used in environments where the solid state nature outweighs the poor efficiency. Thermoelectric junctions are generally only around 5-10% as efficient as the ideal refrigerator (Carnot cycle), compared with 40-60% achieved by conventional compression cycle systems (reverse Rankin systems like a compressor).

A potential replacement for thermoelectric cooling is thermo tunnel cooling.

The effect is used in satellites and spacecraft to counter the effect of direct sunlight on one side of a craft by dissipating the heat over the cold shaded side whereupon the heat is dissipated by radiation into deep space.

Thermoelectric coolers are also used to cool computer components to aid over clocking. In this application, they are competitive with liquid cooling devices.

The Peltier effect is the reverse of the Seebeck effect; a creation of a heat difference from an electric voltage.

It occurs when a current is passed through two dissimilar metals or semiconductors (n-type and p-type) that are connected to each other at two junctions (Peltier junctions). The current drives a transfer of heat from one junction to the other: one junction cools off while the other heats up; as a result, the effect is often used for thermoelectric cooling. This effect was observed in 1834 by Jean Peltier, 13 years after Seebeck's initial discovery.

When a current I is made to flow through the circuit, heat is evolved at the upper junction (at T2), and absorbed at the lower junction (at T1). The Peltier heat absorbed by the lower junction per unit time, is equal to $$Q=\Pi_{AB}I=(\Pi_B-\Pi_A)I$$

Where Π is the Peltier coefficient ΠAB of the entire thermocouple, and ΠA and ΠB are the coefficients of each material. P-type silicon typically has a positive Peltier coefficient (though not above ~550 K), and n-type silicon is typically negative.

The Peltier coefficients represent how much heat current is carried per unit charge through a given material. Since charge current must be continuous across a junction, the associated heat flow will develop a discontinuity if ΠA and ΠB are different. This causes a non-zero divergence at the junction and so heat must accumulate or deplete there, depending on the sign of the current. Another way to understand how this effect could cool a junction is to note that when electrons flow from a region of high density to a region of low density, they expand (as with an ideal gas) and cool.

The conductors are attempting to return to the electron equilibrium that existed before the current was applied by absorbing energy at one connector and releasing it at the other. The individual couples can be connected in series to enhance the effect.

An interesting consequence of this effect is that the direction of heat transfer is controlled by the polarity of the current; reversing the polarity will change the direction of transfer and thus the sign of the heat absorbed/evolved.

A Peltier cooler/heater or thermoelectric heat pump is a solid-state active heat pump which transfers heat from one side of the device to the other. Peltier coolers are also called thermo-electric coolers (TEC).

Figure 6A:
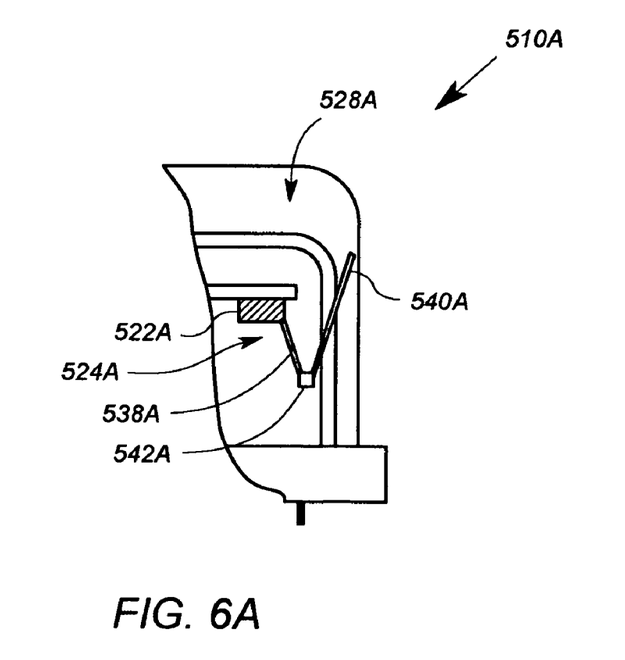
FIG. 6A is a partial diagram of another embodiment of a meter with a different heat removal arrangement.

Referring now to FIG. 5A, the meter of the present invention may be in the form of meter 510A which alternatively use an arrangement 524A for moving heat. The arrangement 524A utilizes a first metal 538A attached to the component 522A and a second dissimilar metal 540A welded by weld 542A to the first metal 538A and positioned at least partially in the outer compartment 528A.

Referring again to FIG. 1, in the embodiments described herein, the space between the inner and outer covers 16 and 18 may suitably be between a 1/8" and 1/2" thick. The portion 24a of the heat sink 24 in the compartment 30 may suitably be 1/2" wide by 1/4" thick while the portion of the heat sink in the compartment 28 may suitably be 1/2" wide by 1/16" thick. The increased width within the compartment 30 allows for more heat to be propagated out of the compartment with greater efficiency. It is also advantageous to increase the surface area of the heat sink and/or thickness thereof in the compartment 28. The heat sink 24 is relatively heat conductive and may suitably be formed of aluminum.

The inner cover 16 may suitably be formed of polycarbonate that is not transparent, while the outer cover 18 is preferably at least partially transparent to allow for reading of a meter display, not shown in FIG. 1. The meter display is, as is known in the art, disposed under the outer cover 18, and may be disposed on or immediately below the inner cover 16. If the meter display is below the inner cover 16, then the inner cover 16 will have an opening through which visual observation of the meter display is possible.

Figure 7:
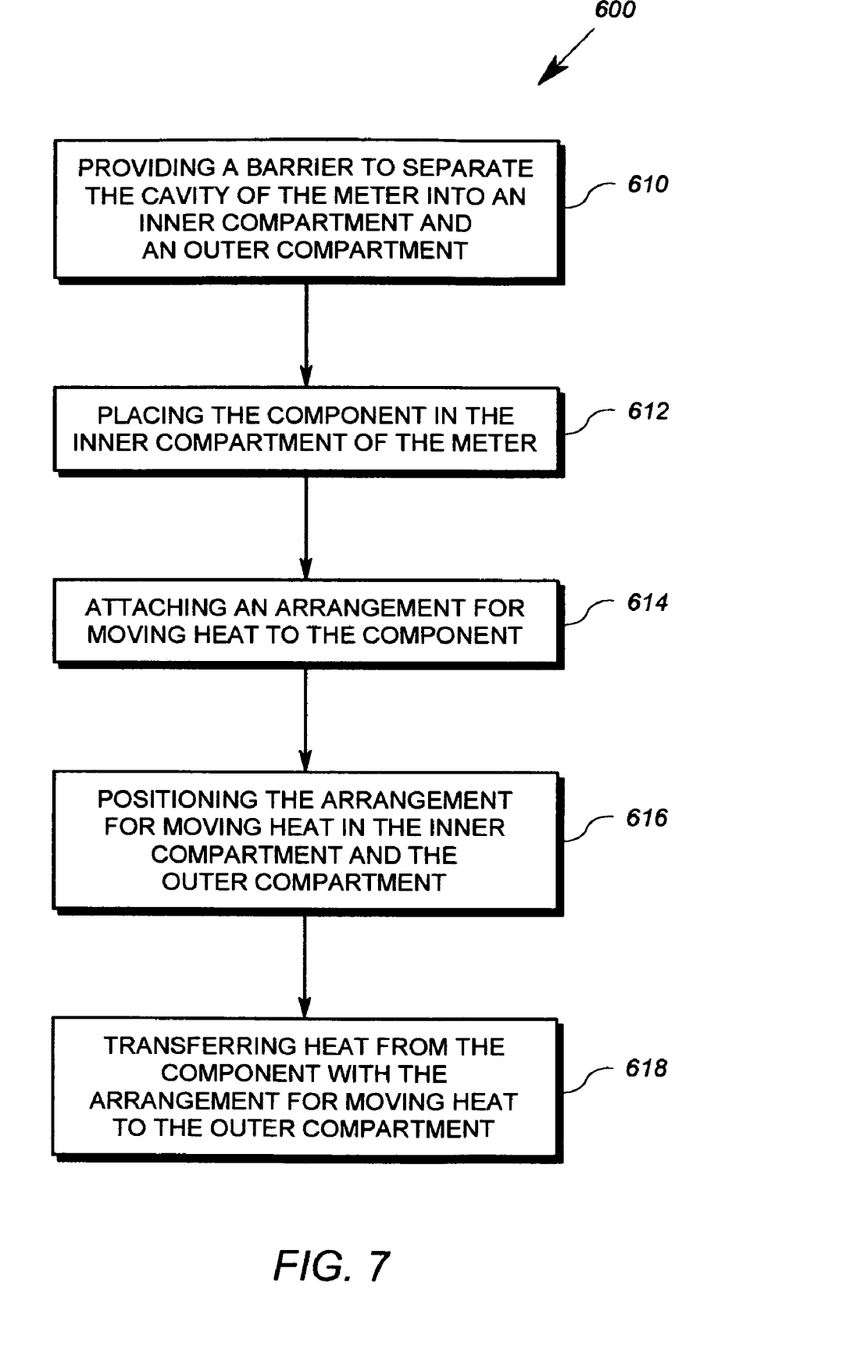
FIG. 7 shows a flowchart detailing the basic steps of cooling a heat generating component in a utility meter according the present invention.

Referring now to FIG. 7, yet another embodiment of the present invention is shown as method 600 for removing heat from a component in a cavity of a utility meter. The method includes first step 610 of providing a barrier to separate the cavity of the meter into an inner compartment and an outer compartment and second step 612 of placing the component in the inner compartment of the meter. The method also includes the third step 614 of attaching an arrangement for moving heat to the component and the fourth step 616 of positioning the arrangement for moving heat in the inner compartment and the outer compartment. The method further includes the fifth step 618 of transferring heat from the component with the arrangement for moving heat to the outer compartment.

It will be appreciated that the above described embodiments are merely exemplary, and that those of ordinary skill in the art may readily devise their own implementations and modifications that incorporate the principles of the present invention and fall within the spirit and scope thereof.

I claim:

1. An arrangement for use in an electric utility meter comprising:
   a base;
   a thermally insulated barrier operably associated with said base and defining a first compartment therebetween;
   a heat generating component positioned in the first compartment and operably associated with said base;
   a cover extending from said base, said cover and said barrier defining a second compartment therebetween; and
   an arrangement for moving heat connected to said heat generating component and extending from the first compartment to the second compartment.

2. The arrangement of claim 1, wherein said arrangement for moving heat comprises heat conductive member.

3. The arrangement of claim 1, wherein said barrier seals said first compartment from said second compartment.

4. A method for removing heat from a component in a cavity of a utility meter comprising the steps of:
   providing a barrier to separate the cavity of the meter into an inner compartment and an outer compartment
   placing the component in the inner compartment of the meter;
   attaching an arrangement for moving heat to the component;
   positioning the arrangement for moving heat such that it extends through the barrier; and
   transferring heat from the component with the arrangement for moving heat to the outer compartment.

5. An arrangement for use in a utility meter comprising:
   a base;
   a first barrier operably associated with said base and defining a first compartment therebetween;
   a heat generating component positioned in the first compartment and operably associated with said base;
   a second barrier extending from said base, said second barrier and said first barrier defining a second compartment therebetween; and
   a heat transfer arrangement connected to said heat generating component, the heat transfer arrangement comprising a heat conductive member extending through the first barrier from the first compartment to the second compartment.

6. The arrangement of claim 5, wherein said heat conductive member contacts said heat generating component.

7. The arrangement of claim 5, wherein the first barrier isolates the first compartment from the second compartment.

8. The arrangement of claim 5, wherein the first barrier defines an area in which a substantial amount of heat may be held away from said heat generating component.

9. The arrangement of claim 5, wherein the second barrier defines a sealed cover.

10. The arrangement of claim 5, wherein the first barrier is thermally insulated.

11. The arrangement of claim 5, further comprising an insulating material covering at least a portion of said heat generating component.

12. The arrangement of claim 5, wherein at least a portion of said second barrier is transparent.

13. The arrangement of claim 5, wherein said first barrier and said second barrier are spaced from each other from about 0.120 inches to 0.50 inches.

14. The arrangement of claim 5, wherein said heat conductive member comprises a metal.

15. The arrangement of claim 5 wherein said heat conductive member comprises aluminum.

16. The arrangement of claim 5, wherein said heat conductive member comprises:
   a first portion located in the first compartment; and
   a second portion located in the second compartment, the first portion having a cross section and the second portion having a cross section, the cross section of the second portion being flatter than the cross section of the first portion.

17. The arrangement of claim 5 wherein said heat conductive member comprises:
   a first portion located in the first compartment; and
   a second portion located in the second compartment, the first portion having an external surface area and the second portion having a an external surface area, the external surface area of the second portion being greater than the external surface area of the first portion.

18. The arrangement of claim 5, wherein said heat generating component comprises a power line carrier modem circuit operably connected to the base for providing data communications therefrom, said power line carrier modem circuit connected to said arrangement for moving heat.

19. The arrangement of claim 5 wherein said heat transfer arrangement includes a thermoelectric cooling device.

20. The arrangement of claim 5 wherein said heat transfer arrangement includes a heat pipe.

* * * * *